(12) United States Patent
Park

(10) Patent No.: US 8,461,593 B2
(45) Date of Patent: Jun. 11, 2013

(54) DISPLAY APPARATUS AND METHOD OF MANUFACTURING THE SAME

(75) Inventor: Sun Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 63 days.

(21) Appl. No.: 13/102,927

(22) Filed: May 6, 2011

(65) Prior Publication Data

US 2012/0097953 A1 Apr. 26, 2012

(30) Foreign Application Priority Data

Oct. 26, 2010 (KR) .......................... 10-2010-0104699

(51) Int. Cl.
*H01L 29/04* (2006.01)

(52) U.S. Cl.
USPC ................... 257/59; 257/40; 257/57; 257/60; 257/72; 257/79; 438/30; 438/34; 438/149; 438/151; 438/167

(58) Field of Classification Search
None
See application file for complete search history.

(56) References Cited

U.S. PATENT DOCUMENTS

| 6,829,023 | B2 * | 12/2004 | Goto | 349/113 |
| 6,930,732 | B2 * | 8/2005 | Oh et al. | 349/42 |
| 7,522,224 | B2 * | 4/2009 | Hwang et al. | 349/38 |
| 2002/0195967 | A1 * | 12/2002 | Kim et al. | 315/169.3 |
| 2006/0113900 | A1 * | 6/2006 | Oh | 313/504 |

FOREIGN PATENT DOCUMENTS

| KR | 10-2004-0108242 A | 12/2004 |
| KR | 10-2005-0051076 A | 6/2005 |
| KR | 10-2006-0057945 A | 5/2006 |
| KR | 10-2006-0121017 A | 11/2006 |

\* cited by examiner

*Primary Examiner* — Kyoung Lee
(74) *Attorney, Agent, or Firm* — Christie, Parker & Hale, LLP

(57) ABSTRACT

A display apparatus includes a thin film transistor provided on a substrate and a pixel electrically coupled to the thin film transistor. The thin film transistor includes a semiconductor layer on the substrate, a first insulating layer on the semiconductor layer and having a first contact hole and a second contact hole, a source electrode on the first insulating layer and making contact with the semiconductor layer through the first contact hole, a drain electrode on the first insulating layer and making contact with the semiconductor layer through the second contact hole, a gate electrode between the source electrode and the drain electrode and having a stacked structure including a first conductive layer and a second conductive layer, and a second insulating layer between the source electrode and the drain electrode and covering the gate electrode.

16 Claims, 6 Drawing Sheets

DISPLAY APPARATUS AND METHOD OF MANUFACTURING THE SAME

CROSS-REFERENCE TO RELATED APPLICATION

This application claims priority to and the benefit of Korean Patent Application No. 10-2010-0104699, filed on Oct. 26, 2010, in the Korean Intellectual Property Office, the entire content of which is incorporated herein by reference.

BACKGROUND

1. Field

Embodiments of the present invention relate to a display apparatus and a manufacturing method thereof.

2. Description of Related Art

Unlike liquid crystal display apparatuses requiring a light source, organic light emitting display apparatuses are self-emission type apparatuses, and do not need a light source. Therefore, organic light emitting display apparatuses may have advantages of being thin and being driven by low power.

Due to the advantages of organic light emitting display apparatuses, recently liquid crystal display apparatuses are superseded by organic light emitting display apparatuses, and research for a method of manufacturing organic light emitting display apparatuses with low cost is ongoing.

SUMMARY

Accordingly, embodiments of the present invention have been made to provide a display apparatus having improved display quality.

Embodiments of the present invention also provide a method of manufacturing the above-mentioned display apparatus.

In order to achieve the foregoing and/or other aspects according to an embodiment of the present invention, there is provided a display apparatus including a substrate, a thin film transistor on the substrate, and a pixel electrically coupled to the thin film transistor, wherein the thin film transistor includes a semiconductor layer on the substrate, a first insulating layer on the semiconductor layer and having a first contact hole and a second contact hole, a source electrode on the first insulating layer and making contact with the semiconductor layer through the first contact hole, a drain electrode on the first insulating layer and making contact with the semiconductor layer through the second contact hole, a gate electrode between the source electrode and the drain electrode and having a stacked structure including a first conductive layer and a second conductive layer, and a second insulating layer between the source electrode and the drain electrode and covering the gate electrode.

The pixel may include a first electrode on the first insulating layer and electrically coupled to the drain electrode, an organic light emitting layer on the first electrode, and a second electrode on the organic light emitting layer.

The first electrode may include a third conductive layer, and a fourth conductive layer on an end of the third conductive layer and making contact with the drain electrode, wherein the first conductive layer and the third conductive layer include the same material, and the second conductive layer and the fourth conductive layer include a material different than the material of the first conductive layer and the third conductive layer.

Light emitted from the organic light emitting layer may transmit through the substrate.

Bottoms of the first electrode, the gate electrode, the source electrode, and the drain electrode may make contact with the first insulating layer and may be spaced from each other on a surface of the first insulating layer.

The first conductive layer may include a transparent conductive material, and the second conductive layer may include metal.

The second insulating layer may surround lateral sides and an upper side of the gate electrode.

The second insulating layer may be prevented from being overlapped with the source electrode and the drain electrode.

Each of the source electrode and the drain electrode may include a plurality of overlapping conductive layers.

In order to achieve another aspect of embodiments of the present invention, an embodiment of the present invention provides a method of manufacturing a display apparatus as below.

The method includes forming a semiconductor layer in a thin film transistor region on a substrate, forming a first insulating layer for covering the semiconductor layer, forming a gate electrode overlapped with the semiconductor layer on the first insulating layer, forming a first electrode in a pixel region on the substrate, forming a first contact hole and a second contact hole in the first insulating layer for exposing the semiconductor layer, forming a second insulating layer for covering the gate electrode on the first insulating layer, forming a source electrode for making contact with the semiconductor layer through the first contact hole, forming a drain electrode for making contact with the semiconductor layer through the second contact hole, forming an organic light emitting layer on the first electrode, and forming a second electrode on the organic light emitting layer, wherein the source electrode and the drain electrode are separated by the second insulating layer.

Bottoms of the first electrode, the gate electrode, the source electrode, and the drain electrode may make contact with the first insulating layer and may be spaced apart from each other on a surface of the first insulating layer.

The forming a gate electrode may include forming a first reserved conductive layer on the first insulating layer, forming a second reserved conductive layer on the first reserved conductive layer, forming a first conductive layer in the thin film transistor region by patterning the first reserved conductive layer, and forming a second conductive layer in the thin film transistor region by patterning the second reserved conductive layer, and the forming of the pixel electrode may include forming a third conductive layer in the pixel region by patterning the first reserved conductive layer, forming a reserved conductive pattern in the pixel region by patterning the second reserved conductive layer, and forming a fourth conductive layer by removing a portion of the reserved conductive pattern corresponding to the pixel region.

The first conductive layer may include a transparent conductive material, the second conductive layer may include metal, the first conductive layer and the third conductive layer may include a same material, and the second conductive layer and the fourth conductive layer may include a material different from the material of the first conductive layer and the third conductive layer.

The second insulating layer may surround lateral sides and an upper side of the gate electrode.

The second insulating layer may be prevented from being overlapped with the source electrode and the drain electrode.

Each of the source electrode and the drain electrode may include a plurality of overlapping conductive layers.

According to embodiments of the present invention, components that are formed around the first electrode are prevented from over-etching while forming the first electrode in the pixel region, so that dimensional error that may be generated between the components can be minimized or reduced.

According to embodiments of the present invention, a metal layer formed in the pixel region is easily removed so that light provided to the outside through the pixel region can be prevented from being blocked by the metal layer. Therefore, quantity of light provided to the outside by the display apparatus is increased so that quality of the display apparatus can be improved.

BRIEF DESCRIPTION OF THE DRAWINGS

The accompanying drawings, together with the specification, illustrate exemplary embodiments of the present invention, and, together with the description, serve to explain aspects of embodiments of the present invention.

DETAILED DESCRIPTION

Figure 1:
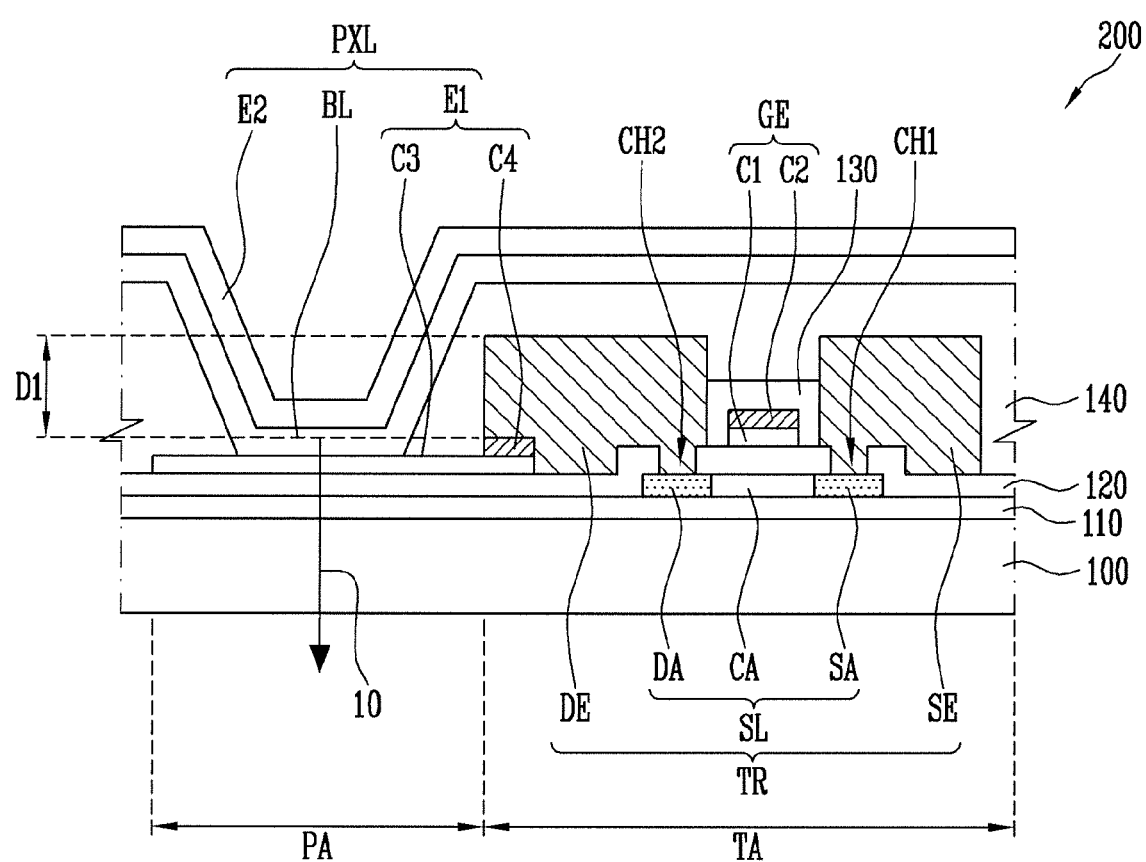
FIG. 1 is a partial sectional view illustrating a display apparatus according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature, and not restrictive. In addition, when an element is referred to as being "on" another element, it can be directly on the another element or indirectly on the another element with one or more intervening elements interposed therebetween. Also, when an element is referred to as being "coupled to" or "connected to" another element, it can be directly coupled to or connected to the another element or indirectly coupled to or connected to the another element with one or more intervening elements interposed therebetween. Hereinafter, like reference numerals refer to like elements.

The following detailed description includes many specific details. The inclusion of such details is for the purpose of illustration only and should not be understood to limit the embodiments of the present invention. Throughout this discussion, similar elements are referred to by similar numbers in the various figures, for reference. In addition, features in one embodiment of the present invention may be combined with features in other embodiments of the present invention.

FIG. 1 is a partial sectional view illustrating a display apparatus according to an embodiment of the present invention. A display apparatus 200 includes a plurality of pixels and a plurality of thin film transistors electrically coupled to the plurality of pixels one by one. The plurality of pixels has the same structure as one another, and the plurality of thin film transistors has the same structure as one another. Therefore, in the description with reference to FIG. 1, one pixel PXL of the plurality of pixels and one thin film transistor TR of the plurality of thin film transistors will be described as examples, and the description of the remaining pixels of the plurality of pixels and the remaining thin film transistors of the plurality of thin film transistors will be omitted.

Referring to FIG. 1, the display apparatus 200 includes a substrate 100, a thin film transistor TR, and a pixel PXL.

The substrate 100 has a pixel region PA and a thin film transistor region TA. In the embodiment of the present invention illustrated in FIG. 1, the substrate 100 may contain a material having excellent light transmission such as glass, so that light 10 generated from the pixel PXL may transmit through the substrate 100, and the light 10 may be provided to the outside.

A buffer layer 110 is provided on the substrate 100. In the embodiment of the present invention illustrated in FIG. 1, the buffer layer 110 may contain silicon oxide (SiOx) or silicone nitride (SiNx), and may prevent impurities from flowing from the substrate 100 to the pixel PXL and the thin film transistor TR.

The thin film transistor TR is provided in the thin film transistor region TA. The thin film transistor TR includes a gate electrode GE, a semiconductor layer SL, a source electrode SE, and a drain electrode DE. The thin film transistor TR is turned on by an externally provided gate signal provided to the gate electrode GE, and switches (e.g., switches on) to provide an externally provided data signal to the pixel PXL through the source electrode SE.

The detail of the structure of the thin film transistor TR is as follows. The semiconductor layer SL is provided on the buffer layer 110 and includes a source area SA, a drain area DA, and a channel area CA located between the source area SA and the drain area DA. In the embodiment of the present invention illustrated in FIG. 1, the semiconductor layer SL may contain poly-crystal silicon or amorphous silicon, and respective dopant concentrations of the source area SA and the drain area DA may be higher than that of the channel area CA.

A first insulating layer 120 is provided on the substrate 100 and covers the semiconductor layer SL. In the first insulating layer 120, a first contact hole CH1 corresponding to a position of the source area SA, and a second contact hole CH2 corresponding to a position of the drain area DA, are formed.

The gate electrode GE is provided on the first insulating layer 120. In the embodiment of the present invention illustrated in FIG. 1, the gate electrode GE includes a first conductive layer C1 and a second conductive layer C2 provided on the first conductive layer C1. The first conductive layer C1 may contain conductive material having excellent light transmission, such as indium tin oxide (ITO) and/or indium zinc oxide (IZO), and the second conductive layer C2 may contain metal having excellent electric conductivity such as aluminum and/or nickel.

The source electrode SE is provided on the first insulating layer 120, and makes contact with the source area SA through the first contact hole CH1. In addition, the drain electrode DE is provided on the first insulating layer 120, and makes contact with the drain area DA through the second contact hole CH2.

According to the embodiment of the present invention illustrated in FIG. 1, bottoms of the gate electrode GE, the source electrode SE, and the drain electrode DE make contact with the first insulating layer 120. Therefore, the gate electrode GE, the source electrode SE, and the drain electrode DE are arranged to be spaced apart from each other on the same surface, or plane, of the first insulating layer 120. The gate electrode GE, the source electrode SE, and the drain electrode DE may be referred to as being at the same layer.

A second insulating layer 130 is provided on the first insulating layer 120 and covers the gate electrode GE. In more detail, the second insulating layer 130 surrounds upper and lateral sides of the gate electrode GE, and covers the gate electrode GE between the source electrode SE and the drain electrode DE. Therefore, the gate electrode GE is insulated from the source electrode SE and the drain electrode DE by the second insulating layer 130. In addition, according to the structure of the above-described second insulating layer 130, since the second insulating layer 130 is not positioned between the source electrode SE and the substrate 100, or between the drain electrode DE and the substrate 100, the second insulating layer 130 is not overlapped with the source electrode SE and the drain electrode DE on the plane (e.g., surface).

The pixel PXL is provided in the pixel region PA, and includes a first electrode E1, an organic light emitting layer BL, and a second electrode E2. The first electrode E1 is electrically coupled to the drain electrode DE. Therefore, when the thin film transistor TR is turned on by the gate signal, the data signal may be provided to the first electrode E1 through the drain electrode DE.

In the embodiment of the present invention illustrated in FIG. 1, the first electrode E1 may include a third conductive layer C3 and a fourth conductive layer C4 that is provided on an end of the third conductive layer C3 and makes contact with the drain electrode DE, wherein the third conductive layer C3 may contain the same material as that of the first conductive layer C1, and the fourth conductive layer C4 may contain the same material as that of the second conductive layer C2. In addition, the fourth conductive layer C4 is provided in the thin film transistor area TA such that light 10 may be easily provided to the outside by transmitting through the third conductive layer C3 and the substrate 100.

In addition, in the embodiment of the present invention illustrated in FIG. 1, the bottom of the first electrode E1 makes contact with the first insulating layer 120. Therefore, the first electrode E1 is arranged on the plane of the first insulating layer 120 together with the gate electrode GE, the source electrode SE, and the drain electrode DE.

A third insulating layer 140 is provided on the substrate 100, and covers the first electrode E1 and the thin film transistor TR. In addition, the third insulating layer 140 is open at a portion corresponding to the pixel region PA to define a region where the third conductive layer C3 makes contact with the organic light emitting layer BL.

The organic light emitting layer BL is provided on the third insulating layer 140 in the thin film transistor region TA, and makes contact with the third conductive layer C3 through an open portion of the third insulating layer 140 in the pixel region PA.

The second electrode E2 is provided on the organic light emitting layer BL, and receives an externally supplied common voltage. Therefore, when the thin film transistor TR is turned on, the organic light emitting layer BL may emit light 10 by a potential difference formed between the first electrode E1 and the second electrode E2.

As described above, the gate electrode GE, the source electrode SE, and the drain electrode DE are arranged in parallel on the same plane. In addition, the second insulating layer 130 covers the upper side and lateral sides of the gate electrode GE, and is not positioned between the source electrode SE and the substrate 100, or between the drain electrode DE and the substrate 100. Therefore, depth D1 defined from the upper side of the source electrode SE or the drain electrode DE to the upper side of the fourth conductive layer C4 may be reduced by thickness of the second insulating layer 130 (e.g., D1 may be reduced due to the absence of the second insulating layer 130 between the drain electrode DE and the substrate 100, which would cause the distance of the upper side of the drain electrode DE from the substrate 100 to be increased).

Unlike in the embodiment of the present invention illustrated in FIG. 1, when the second insulating layer 130 is positioned between the substrate 100 and the source electrode SE, and between the substrate 100 and the drain electrode DE, the depth D1 may be increased by thickness of the second insulating layer 130. In view of a process of manufacturing the display apparatus 200, it is not easy to selectively remove the fourth conductive layer C4 from only the pixel region PA as the depth D1 is increased. When the fourth conductive layer 140 remains in the pixel region PA, light 10 is blocked by the fourth conductive layer 140, and the quantity of the light 10 provided to the outside may be reduced. However, according to the above-described embodiment of the present invention illustrated in FIG. 1, the depth D1 may be minimized or reduced by modifying the structure of the second insulating layer 130. This will be described in detail with reference to FIGS. 3 to 11.

Figure 2:
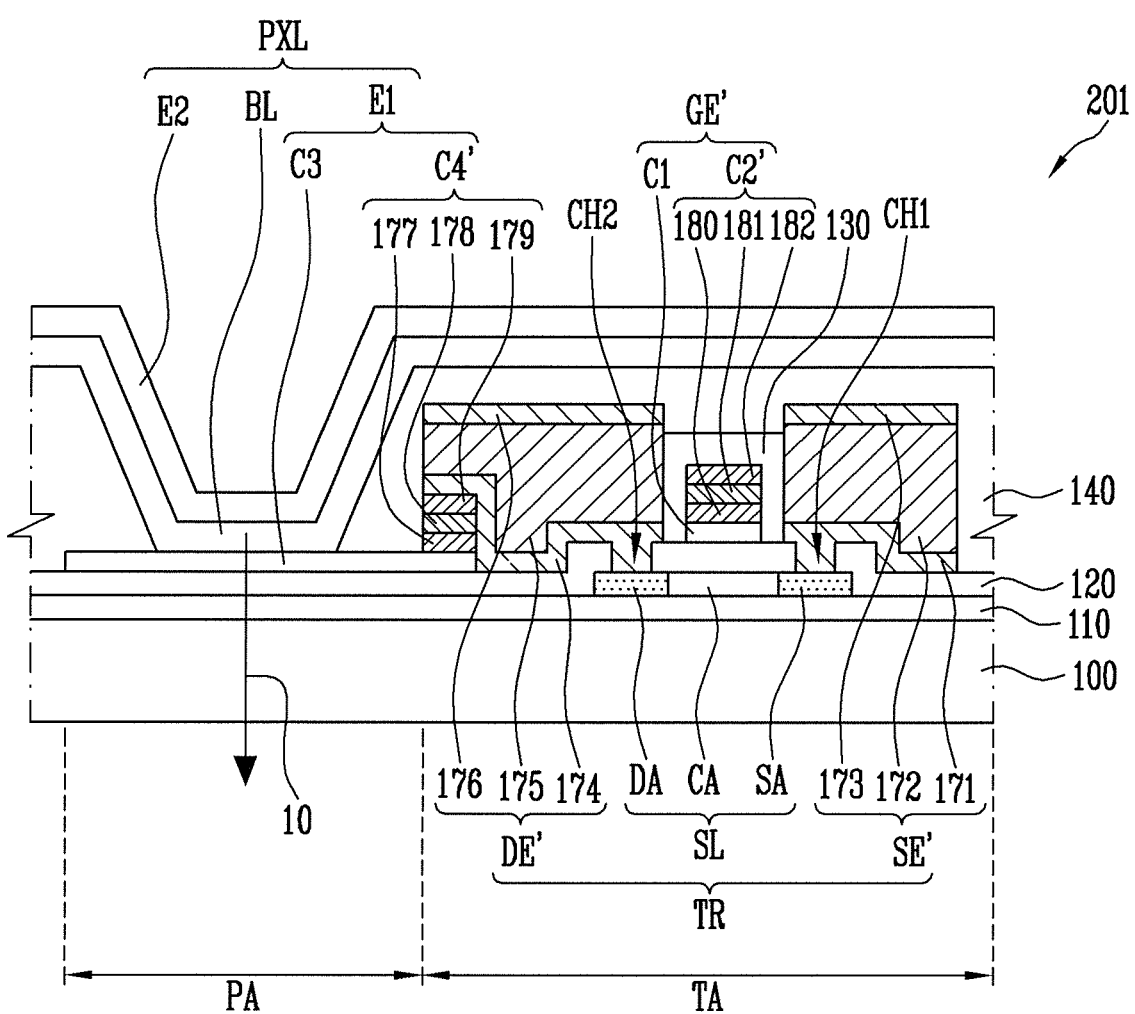
FIG. 2 is a partial sectional view illustrating a display apparatus according to another embodiment of the present invention.

FIG. 2 is a sectional view illustrating a display apparatus according to another embodiment of the present invention. In the description with reference to FIG. 2, same reference numerals are assigned to the elements that have been described with reference to FIG. 1, and description thereof will be omitted.

Referring to FIG. 2, a display apparatus 201 includes a substrate 100 having a pixel region PA and a thin film transistor region TA, a thin film transistor TR provided in the thin film transistor region TA, and a pixel PXL provided in the pixel region PA.

The thin film transistor TR includes a semiconductor layer SL, a gate electrode GE', a source electrode SE', and a drain electrode DE'.

Unlike the embodiment of the present invention illustrated in FIG. 1, each of the source electrode SE' and the drain electrode DE' includes a plurality of conductive layers to be overlapped with each other. More specifically, the source electrode SE' includes a first auxiliary conductive layer 171, a second auxiliary conductive layer 172, and a third auxiliary conductive layer 173, while the drain electrode DE' includes a fourth auxiliary conductive layer 174, a fifth auxiliary conductive layer 175, and a sixth auxiliary conductive layer 176.

In the embodiment of the present invention illustrated in FIG. 2, each of the first, the third, the fourth, and the sixth auxiliary conductive layers 171, 173, 174, and 176 may contain a different layer (e.g., different material) than the second and the fifth auxiliary conductive layers 172 and 175. For example, the first, the third, the fourth, and the sixth auxiliary conductive layers 171, 173, 174, and 176 may contain a semiconductor layer and molybdenum or titanium having low contact resistance, and the second and the fifth auxiliary conductive layers 172 and 175 may contain aluminum or nickel having excellent electric conductivity.

The first electrode E1 includes a third conductive layer C3 and a fourth conductive layer C4', wherein the fourth conductive layer C4' includes a seventh auxiliary conductive layer 177, an eighth auxiliary conductive layer 178, and a ninth auxiliary conductive layer 179 that are overlapped with each other. In the embodiment of the present invention illustrated in FIG. 2, the seventh and the ninth auxiliary conductive layers 177 and 179 may include a different layer (e.g., a material different than that of the eighth auxiliary conductive layer 178), for example, the third conductive layer C3 and molybdenum or titanium having low contact resistance, and the eighth auxiliary conductive layer 178 may contain aluminum or nickel having excellent electric conductivity.

In addition, the gate electrode GE' includes a first conductive layer C1 and a second conductive layer C2', wherein the second conductive layer C2' includes a tenth auxiliary conductive layer 180, an eleventh auxiliary conductive layer 181, and a twelfth auxiliary conductive layer 182. In the embodiment of the present invention illustrated in FIG. 2, each of the tenth and the twelfth auxiliary conductive layers 180 and 182 may include a different layer (e.g., a material different than that of the eleventh auxiliary conductive layer 181), for example, the first conductive layer C1 and molybdenum or titanium having low contact resistance, and the eleventh auxiliary conductive layer 181 may contain aluminum or nickel having excellent electric conductivity.

FIGS. 3 to 11 are views illustrating a method of manufacturing the display apparatus of the embodiment of the present invention illustrated in FIG. 1. In the description with reference to FIGS. 3 to 11, same reference numerals are assigned to the elements that have been described with reference to FIG. 1 and description thereof will be omitted.

Figure 3:
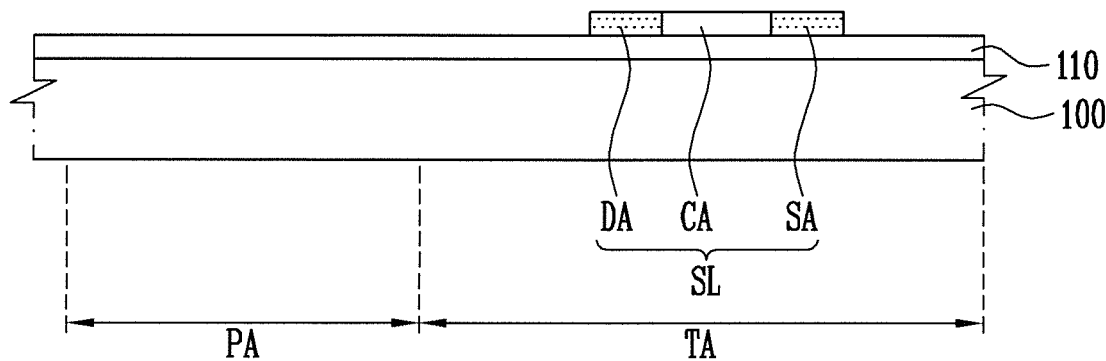
FIGS. 3 to 11 are views illustrating a method of manufacturing the display apparatus of FIG. 1 according to an embodiment of the present invention.

Referring to FIG. 3, a substrate 100 having a pixel region PA and a thin film transistor region TA is prepared, and a buffer layer 110 is formed on the substrate 100. After that, a semiconductor layer SL having a channel area CA, a source area SA, and a drain area DA is formed in the thin film transistor region TA.

According to the embodiment of the present invention illustrated in FIG. 3, the semiconductor layer SL may be formed by forming an amorphous silicon layer on the buffer layer 110 and crystallizing the same using one of solid phase crystallization (SPC), liquid phase recrystallization (LPR), excimer laser annealing (ELA), and sequential lateral solidification (SLS), and by forming a source area SA and a drain area DA into which dopant is injected by performing a dopant injection process.

Figure 4:
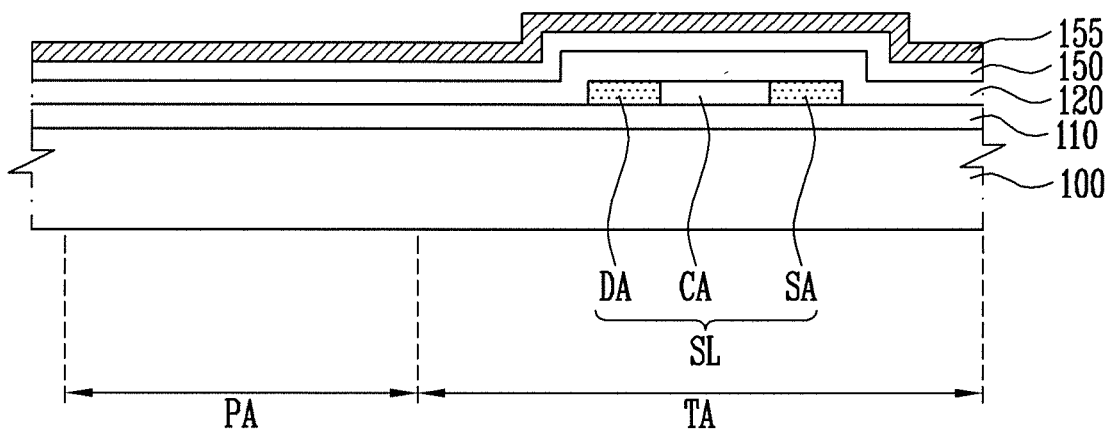

Referring to FIG. 4, a first insulating layer 120 is formed on the semiconductor layer SL. After that, a first reserved conductive layer 150 and a second reserved conductive layer 155 are sequentially formed on the first insulating layer 120.

The first reserved conductive layer 150 is a layer becoming a source of a first conductive layer (C1 of FIG. 1) and a third conductive layer (C3 of FIG. 1), wherein the first reserved conductive layer 150 may be a transparent layer such as indium tin oxide or indium zinc oxide. The second reserved conductive layer 155 is a layer becoming a source of a second conductive layer (C2 of FIG. 1) and a fourth conductive layer (C4 of FIG. 1), and may contain aluminum or nickel.

Figure 5:
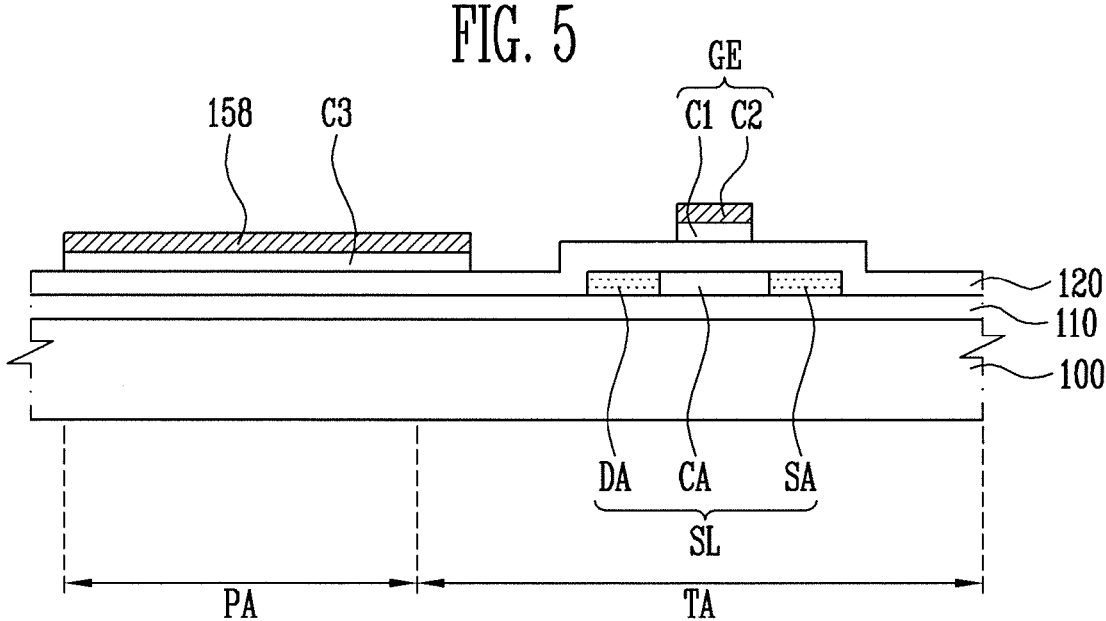
Figure 6:
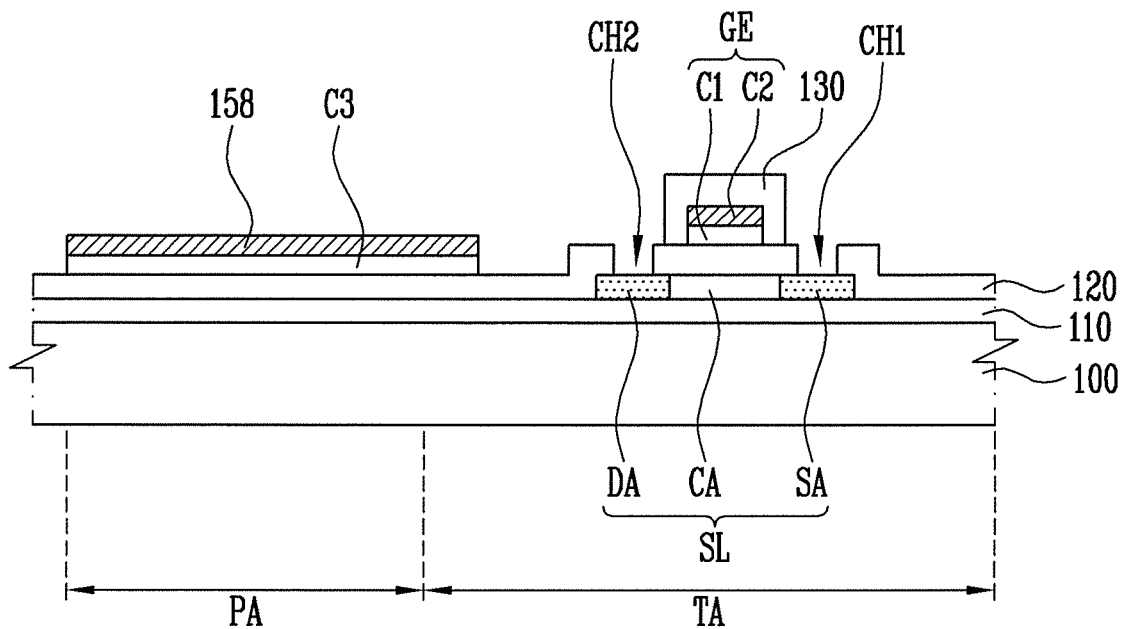

Referring to FIGS. 5 and 6, a first reserved conductive layer (150 of FIG. 4) and a second reserved conductive layer (155 of FIG. 4) are patterned. As a result, a gate electrode GE, including a first conductive layer C1 and a second conductive layer C2, is formed in a thin film transistor region TA, and a third conductive layer C3 and a reserved conductive pattern 158 are formed in a pixel region PA.

After that, a second insulating layer 130 is formed on the first insulating layer 120. The second insulating layer 130, as described above with reference to FIG. 1, covers the upper sides and the lateral sides of the gate electrode GE. After that, a first contact hole CH1 is formed on the first insulating layer 120 to expose a source area SA, and a second contact hole CH2 is formed on the first insulating layer 120 to expose a drain area DA.

If a process of forming the second insulating layer 130 is referred to as a first process, and a process of forming the first and the second contact holes CH1 and CH2 is referred to as a second process, the first and the second processes may be carried out by one-time etching using a slit mask or a half tone mask as an etching mask, or by total twice etching using different etching masks.

Figure 7:
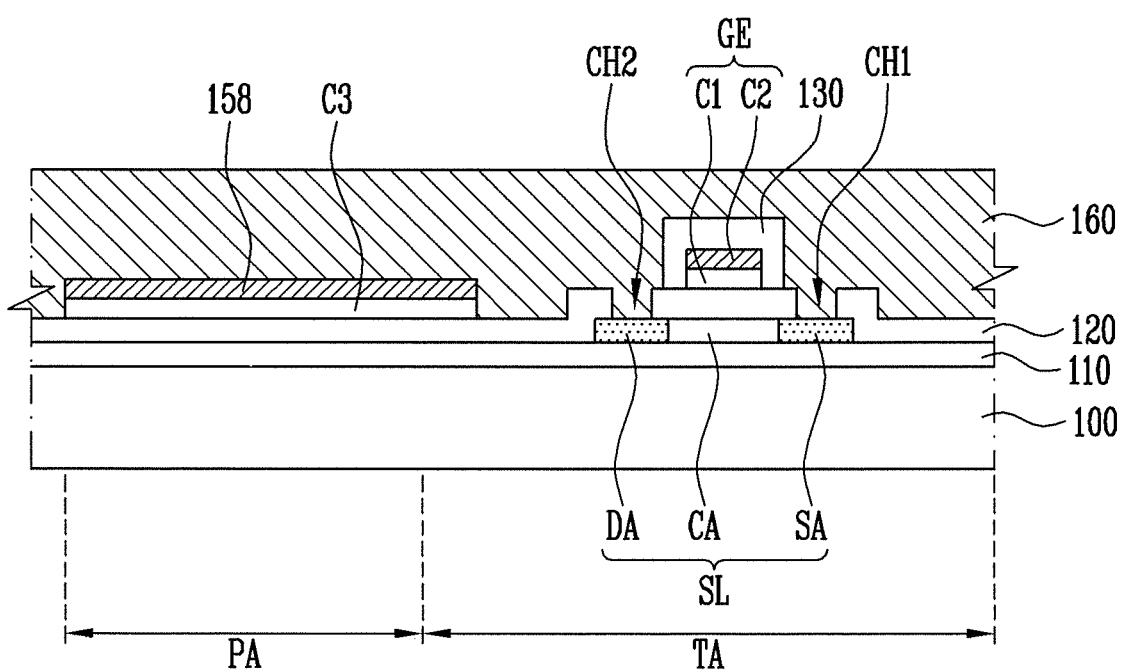

Referring to FIG. 7, a third reserved conductive layer 160 is formed on a substrate 100. The third reserved conductive layer 160 is formed on the substrate 100 where a semiconductor layer SL, a third conductive layer C3, and a reserved conductive pattern 158 are formed and, as a result, makes contact with a source area SA through a first contact hole CH1, makes contact with a drain area DA through a second contact hole CH2, and also makes contact with the reserved conductive pattern 158.

Figure 8:
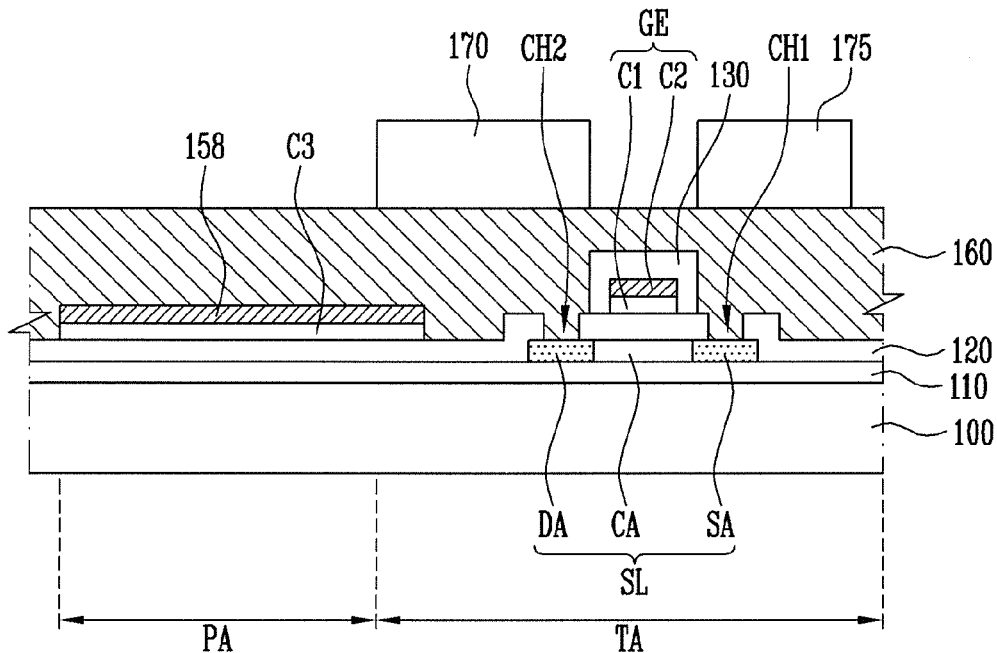
Figure 9:
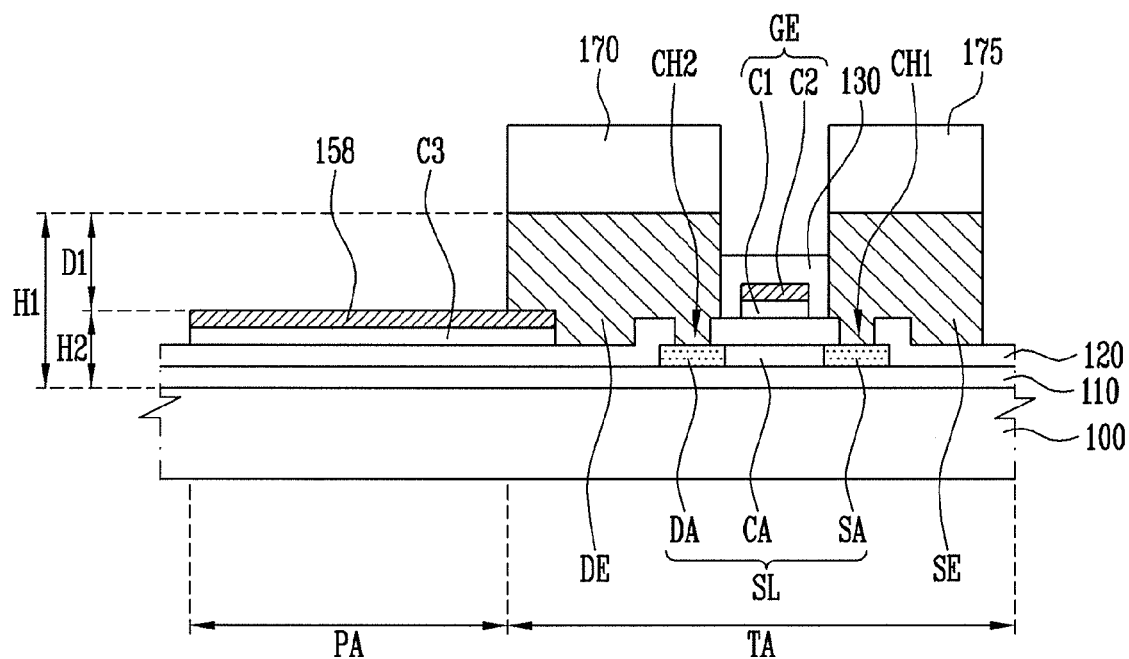

Referring to FIGS. 8 and 9, after forming a third reserved conductive layer 160, a first mask pattern 175 and a second mask pattern 170 are formed on the third reserved conductive layer 160. The first mask pattern 175 is formed to be overlapped with the first contact hole CH1 on a plane, and the second mask pattern 170 is formed to be overlapped with the second contact hole CH2 and partially with (e.g., with a portion of) a reserved conductive pattern 158.

Referring to FIG. 9, the third reserved conductive layer 160 is etched using the first mask pattern 175 and the second mask pattern 170 as an etching mask. As a result, a source electrode SE making contact with a source area SA through the first contact hole CH1 is formed, and a drain electrode DE making contact with a drain area DA through the second contact hole CH2 is formed. In addition, the drain electrode DE is partially overlapped with the reserved conductive pattern 158 on a plane and makes contact with the reserved conductive pattern 158.

Figure 10:
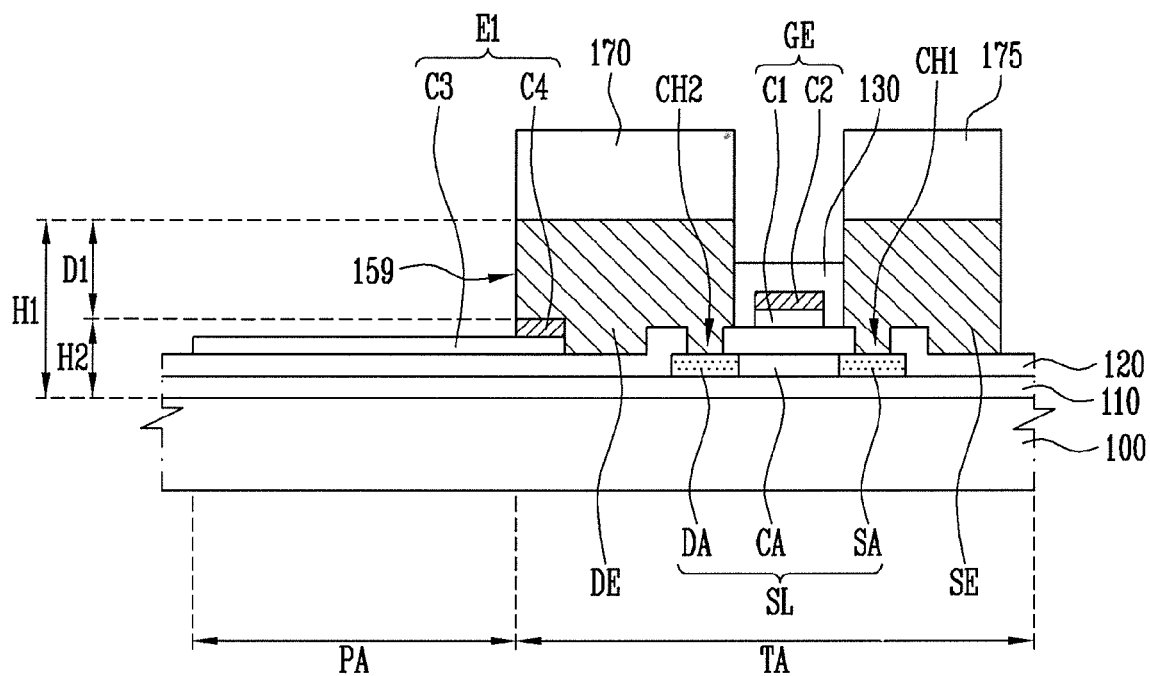

Referring to FIG. 10, after forming the source electrode SE and the drain electrode DE, the rest of the reserved conductive pattern 158, except for a portion or portions making contact with the drain electrode DE, is etched using the first mask pattern 175 and the second mask pattern 170. As a result, a fourth conductive layer C4 is formed, and a first electrode E1 including the third conductive layer C3 and the fourth conductive layer C4 is completed.

If the etching process described with reference to FIG. 9 is referred to as a first etching process, and the etching process described with reference to FIG. 10 is referred to as a second etching process, in the embodiment of the present invention illustrated in FIGS. 9 and 10, since etching material used in the first etching process and the second etching process is identical, the first etching process and the second etching process may be sequentially carried out, and the etching material used in the first etching process may be different from the etching material used in the second etching process.

When the second etching process is carried out, the reserved conductive pattern 158 may be removed such that the reserved conductive pattern 158 does not remain in the pixel region PA. Since the reserved conductive pattern 158 contains metal blocking light (e.g., light 10 of FIG. 1), if the reserved conductive pattern 158 remains in the pixel region PA, the light (10 of FIG. 1) would be blocked by the reserved conductive pattern 158, and the quantity of light provided from the pixel region PA to the outside through the substrate 100 may be reduced.

As described above, in order to maximize or increase the quantity of light provided to the outside, the second etching process is carried out such that the reserved conductive pattern 158 does not remain in the pixel region PA. However, since a third reserved conductive layer (160 of FIG. 8) etched in the first etching process is positioned at the uppermost side of the elements formed on the substrate 100, the third reserved conductive layer 160 may be easily etched. However, since the reserved conductive pattern 158 etched in the second etching process is positioned at a depth D1 lower than an upper surface of the source electrode SE or an upper surface of the drain electrode DE, it may be more difficult to etch the reserved conductive pattern 158 than the third reserved conductive layer 160.

For example, it may be more difficult to control the size of the third conductive layer C3 formed by performing the second etching process than to control the size of the source electrode SE and the drain electrode DE, and lateral sides 159 of the source electrode SE or the drain electrode DE may be over-etched because performing time of the second etching process is increased. In addition, when time required to carry out the second etching process is reduced in order to prevent the over-etching of the source electrode SE or the drain electrode DE, the reserved conductive pattern 158 may remain in the pixel region PA.

The problems that would occur during the performance of the second etching process are caused by the position of the reserved conductive pattern 158, and the more significant the problems are, the deeper the depth D1 may be. Therefore, in order to solve such problems, the elements may be generally designed by considering dimensional error that would be generated between elements such as the source electrode SE, the drain electrode DE, and the third conductive layer C3 to be etched in the second etching process. However, according to a display apparatus (200 of FIG. 1) according to the present embodiment, instead of designing the elements by considering dimensional error that would be generated between the elements, the above-mentioned problems may be prevented by minimizing or reducing the depth D1. This will be described in detail as follows.

If a height from the upper side of the substrate 100 to the upper side of the source electrode SE or to the upper side of the drain electrode DE is referred to as a first height H1, and a height from the upper side of the substrate 100 to the upper side of the reserved conductive pattern 158 is referred to as a second height H2, the depth D1 may be obtained by subtracting the second height H2 from the first height H1. Therefore, if the second height H2 is constant, the smaller the depth D1 is, the lower the first height H1 is.

In order to reduce the first height H1, thickness of the source electrode SE and the drain electrode DE may be thinner. However, in the present embodiment, the second insulating layer 130 is formed to cover the gate electrode GE between the source electrode SE and the drain electrode DE, such that the second insulating layer 130 is not positioned under the source electrode SE and the drain electrode DE.

As described above, when the second insulating layer 130 is formed (e.g., formed to be not between the substrate 100 and the drain electrode DE), the first height H1 and the depth D1 may each be reduced by as much as a thickness of the second insulating layer 130. For example, when the second insulating layer 130 is about 0.5 micrometers to about 2.0 micrometers thick, according to the present embodiment, the first height H1 and the depth D1 may be reduced by about 0.5 micrometers to about 2.0 micrometers. Therefore, dimensional error between the elements to be etched during the performance of the second etching process may be reduced.

Figure 11:
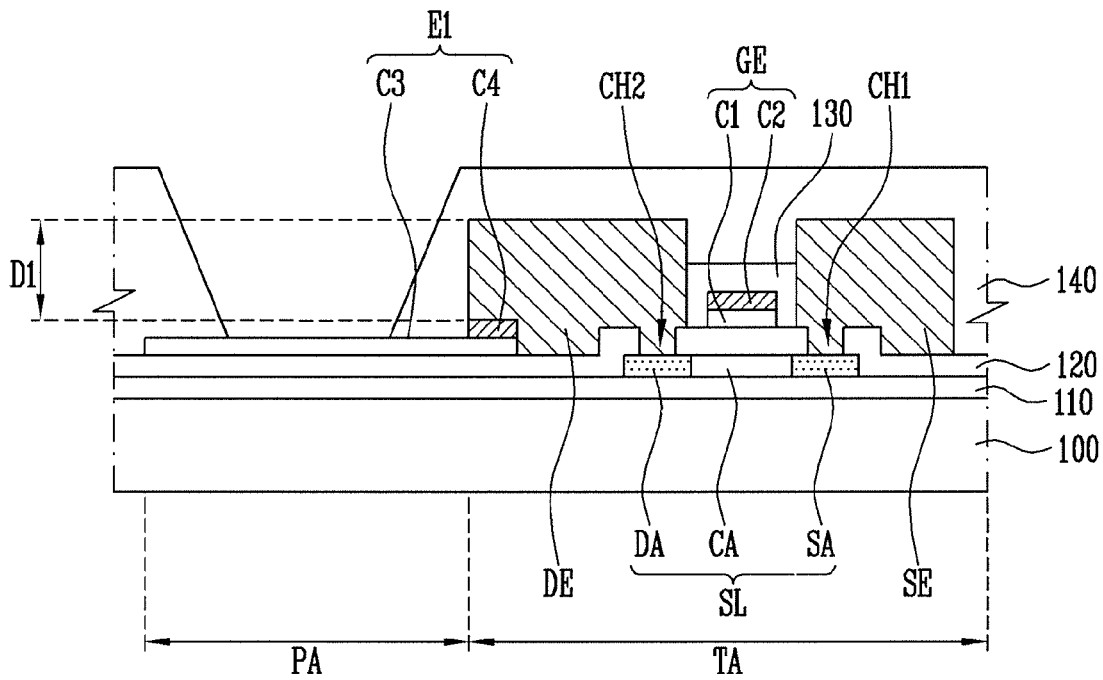

Referring to FIG. 11, the third insulating layer 140 is formed on the substrate 100 on which a thin film transistor TR and a first electrode E1 are formed. According to the present embodiment, the third insulating layer 140 may be formed by forming a reserved insulating layer (not shown) on an entire surface of the substrate 100 to cover the thin film transistor TR and the first electrode E1, and after that, by partially removing the reserved insulating layer to expose the third conductive layer C3 in the pixel region PA.

Referring to FIG. 1 again, the display apparatus 200 is manufactured by forming the third insulating layer 140, by forming an organic light emitting layer BL on the third insulating layer 140 and the third conductive layer C3, and by forming a second electrode E2 on the organic light emitting layer BL.

The present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A display apparatus comprising:
   a substrate;
   a thin film transistor on the substrate; and
   a pixel electrically coupled to the thin film transistor,
   wherein the thin film transistor comprises:
      a semiconductor layer on the substrate;
      a first insulating layer on the semiconductor layer and having a first contact hole and a second contact hole;
      a source electrode on the first insulating layer and making contact with the semiconductor layer through the first contact hole;
      a drain electrode on the first insulating layer and making contact with the semiconductor layer through the second contact hole;
      a gate electrode between the source electrode and the drain electrode and having a stacked structure comprising a first conductive layer and a second conductive layer;
      a second insulating layer between the source electrode and the drain electrode and covering the gate electrode; and
   wherein bottoms of the gate electrode, the source electrode, and the drain electrode make contact with the first insulating layer.

2. The display apparatus as claimed in claim 1, wherein the pixel comprises:
   a first electrode on the first insulating layer and electrically coupled to the drain electrode;
   an organic light emitting layer on the first electrode; and
   a second electrode on the organic light emitting layer.

3. The display apparatus as claimed in claim 2, wherein light emitted from the organic light emitting layer transmits through the substrate.

4. The display apparatus as claimed in claim 1, wherein the first conductive layer comprises a transparent conductive material, and the second conductive layer comprises metal.

5. The display apparatus as claimed in claim 1, wherein the second insulating layer surrounds lateral sides and an upper side of the gate electrode.

6. The display apparatus as claimed in claim 5, wherein the second insulating layer is prevented from being overlapped with the source electrode and the drain electrode.

7. The display apparatus as claimed in claim 1, wherein each of the source electrode and the drain electrode includes a plurality of overlapping conductive layers.

8. A display apparatus comprising:
   a substrate;
   a thin film transistor on the substrate; and
   a pixel electrically coupled to the thin film transistor,
   wherein the thin film transistor comprises:
      a semiconductor layer on the substrate;
      a first insulating layer on the semiconductor layer and having a first contact hole and a second contact hole;
      a source electrode on the first insulating layer and making contact with the semiconductor layer through the first contact hole;

a drain electrode on the first insulating layer and making contact with the semiconductor layer through the second contact hole;
a gate electrode between the source electrode and the drain electrode and having a stacked structure comprising a first conductive layer and a second conductive layer; and
a second insulating layer between the source electrode and the drain electrode and covering the gate electrode,
wherein the pixel comprises:
a first electrode on the first insulating layer and electrically coupled to the drain electrode;
an organic light emitting layer on the first electrode; and
a second electrode on the organic light emitting layer,
wherein the first electrode comprises:
a third conductive layer; and
a fourth conductive layer on an end of the third conductive layer and making contact with the drain electrode, and
wherein the first conductive layer and the third conductive layer comprise the same material, and the second conductive layer and the fourth conductive layer comprise a material different than the material of the first conductive layer and the third conductive layer.

9. A display apparatus comprising:
a substrate;
a thin film transistor on the substrate; and
a pixel electrically coupled to the thin film transistor,
wherein the thin film transistor comprises:
a semiconductor layer on the substrate;
a first insulating layer on the semiconductor layer and having a first contact hole and a second contact hole;
a source electrode on the first insulating layer and making contact with the semiconductor layer through the first contact hole;
a drain electrode on the first insulating layer and making contact with the semiconductor layer through the second contact hole;
a gate electrode between the source electrode and the drain electrode and having a stacked structure comprising, a first conductive layer and a second conductive layer; and
a second insulating layer between the source electrode and the drain electrode and covering the gate electrode,
wherein the pixel comprises:
a first electrode on the first insulating layer and electrically coupled to the drain electrode:
an organic light emitting layer on the first electrode; and
a second electrode on the organic light emitting layer,
wherein bottoms of the first electrode, the gate electrode, the source electrode, and the drain electrode make contact with the first insulating layer and are spaced from each other on a surface of the first insulating layer.

10. A method of manufacturing a display apparatus, the method comprising:
forming a semiconductor layer in a thin film transistor region on a substrate;
forming a first insulating layer for covering the semiconductor layer;
forming a gate electrode overlapped with the semiconductor layer on the first insulating layer;
forming a first electrode in a pixel region on the substrate;
forming a first contact hole and a second contact hole in the first insulating layer for exposing the semiconductor layer;
forming a second insulating layer for covering the gate electrode on the first insulating layer;
forming a source electrode for making contact with the semiconductor layer through the first contact hole;
forming a drain electrode for making contact with the semiconductor layer through the second contact hole;
forming an organic light emitting layer on the first electrode; and
forming a second electrode on the organic light emitting layer,
wherein the source electrode and the drain electrode are separated by the second insulating layer, and
wherein bottoms of the gate electrode, the source electrode, and the drain electrode make contact with the first insulating layer.

11. The method as claimed in claim 10, wherein the second insulating layer surrounds lateral sides and an upper side of the gate electrode.

12. The method as claimed in claim 11, wherein the second insulating layer is prevented from being overlapped with the source electrode and the drain electrode.

13. The method as claimed in claim 10, wherein each of the source electrode and the drain electrode comprises a plurality of overlapping conductive layers.

14. A method of manufacturing a display apparatus, the method comprising:
forming a semiconductor layer in a thin film transistor region on a substrate;
forming a first insulating layer for covering the semiconductor layer;
forming a gate electrode overlapped with the semiconductor layer on the first insulating layer;
forming a first electrode in a pixel region on the substrate;
forming a first contact hole and a second contact hole in the first insulating layer for exposing the semiconductor layer;
forming a second insulating layer for covering the gate electrode on the first insulating layer;
forming a source electrode for making contact with the semiconductor layer through the first contact hole;
forming a drain electrode for making contact with the semiconductor layer through the second contact hole;
forming an organic light emitting layer on the first electrode; and
forming a second electrode on the organic light emitting layer.,
wherein the source electrode and the drain electrode are separated by the second insulating layer,
wherein bottoms of the first electrode, the gate electrode, the source electrode, and the drain electrode make contact with the first insulating layer and are spaced apart from each other on a surface of the first insulating layer.

15. The method as claimed in claim 14, wherein the forming of the gate electrode comprises:
forming a first reserved conductive layer on the first insulating layer;
forming a second reserved conductive layer on the first reserved conductive layer;
forming a first conductive layer in the thin film transistor region by patterning the first reserved conductive layer; and
forming a second conductive layer in the thin film transistor region by patterning the second reserved conductive layer, and
wherein the forming of the first electrode comprises:
forming a third conductive layer in the pixel region by patterning the first reserved conductive layer;

forming a reserved conductive pattern in the pixel region by patterning the second reserved conductive layer; and forming a fourth conductive layer by removing a portion of the reserved conductive pattern corresponding to the pixel region.

16. The method as claimed in claim 15, wherein the first conductive layer comprises a transparent conductive material, the second conductive layer comprises metal, the first conductive layer and the third conductive layer comprise a same material, and the second conductive layer and the fourth conductive layer comprise a material different from the material of the first conductive layer and the third conductive layer.

* * * * *

UNITED STATES PATENT AND TRADEMARK OFFICE
CERTIFICATE OF CORRECTION

PATENT NO. : 8,461,593 B2  Page 1 of 1
APPLICATION NO. : 13/102927
DATED : June 11, 2013
INVENTOR(S) : Sun Park It is certified that error appears in the above-identified patent and that said Letters Patent is hereby corrected as shown below:

In the Claims

Column 12, Claim 14, line 46    Delete "layer.,"
                                Insert -- layer, --

Column 12, Claim 14, line 48    Delete "laver,"
                                Insert -- layer, --

Signed and Sealed this
Nineteenth Day of August, 2014

Michelle K. Lee
*Deputy Director of the United States Patent and Trademark Office*